United States Patent [19]
Ko

[11] Patent Number: 5,321,204
[45] Date of Patent: Jun. 14, 1994

[54] STRUCTURE OF CHARGED COUPLED DEVICE

[75] Inventor: Jun S. Ko, Seoul, Rep. of Korea

[73] Assignee: Gold Star Electron Co., Ltd., Rep. of Korea

[21] Appl. No.: 775,307

[22] Filed: Oct. 11, 1991

[30] Foreign Application Priority Data

Oct. 13, 1990 [KR] Rep. of Korea ............... 16252/1990

[51] Int. Cl.⁵ .......................................... H01L 23/02
[52] U.S. Cl. ..................... 174/52.4; 361/728; 361/772; 257/673; 257/676; 257/692; 257/704
[58] Field of Search ............... 174/52.1, 52.2, 52.3, 174/52.4; 257/673, 676, 678, 690, 692, 704; 361/403, 404, 405, 728, 730, 813

[56] References Cited

U.S. PATENT DOCUMENTS

| 3,706,409 | 12/1972 | Lederer ......................... 257/690 |
| 4,209,355 | 6/1980 | Burns ............................ 257/673 |
| 4,680,618 | 7/1987 | Kuroda et al. . |
| 4,766,479 | 8/1988 | Krum et al. ................... 257/673 |
| 4,806,503 | 2/1989 | Yoshida et al. ............... 257/676 |
| 4,907,061 | 3/1990 | Kottara ......................... 257/690 |

FOREIGN PATENT DOCUMENTS

| 0370738 | 5/1990 | European Pat. Off. ........ 257/673 |
| 58-18949 | 2/1983 | Japan ............................ 257/673 |
| 1032682 | 2/1989 | Japan ............................ 257/673 |

OTHER PUBLICATIONS

Tummala, et al., Microelectronics Packaging Handbook, "Plastic Packaging Process," Van Nostrand Peinhold Publ., pp. 637-638 (No date is available).

Kyocera Catalog, Ceramic Package, pp. 2-3. (No date is available).

Seraphim, Principles of Electronic Package, Chapter 10, McGraw Hill, (No date is available).

Primary Examiner—Leo P. Picard
Assistant Examiner—Bot Ledinh
Attorney, Agent, or Firm—Faegre & Benson

[57] ABSTRACT

A CCD package and a method for assembling a CCD package utilizing a TAB process. The method comprises the steps of preparing a tape for TAB which has outer leads, inner leads and die bonding paddles, bonding a chip on the paddles and then bonding the free ends of the inner leads on the bonding pads of the chip, connecting the inner leads and the outer leads through insulations, adding a light shield layer beneath the chip, and attaching a glass lid to the surface portions of the inner leads positioned just above the chip. Accordingly, packages of light, laminated and simple structure can be obtained, thereby advantageously enabling the compactness of products utilizing CCD elements. Also, the process is also simplified, thereby decreasing the cost of producing CCD elements.

2 Claims, 10 Drawing Sheets

STRUCTURE OF CHARGED COUPLED DEVICE

BACKGROUND OF THE INVENTION

The present invention relates to the structure of a CCD (Charge Coupled Device) package and the method for assembling it. Currently, the CCD packages conventionally used are classified into two general types, plastic packages and ceramic packages. Different processes are used to assemble each type of package. To help better understand the current art in the assembly of CCD packages, each process will be described below in detail.

The first process to be described is the assembly of a ceramic package. Ceramic packages are mainly classified into CERDIP (CERAMIC+DIP) type packages and multilayer type packages. Herein, only the process for assembling a multilayer type ceramic package will be described. FIGS. 1a to 1d help describe this process, while FIG. 1e shows the finished ceramic package.

As a first step, several sheets are prepared by using a powder obtained by mixing an $Al_2O_3$ compound with certain additives. On these sheets, patterns are formed which are to be used in the respective layers of the package. In the forming of these patterns, metal pads of leads which are to be wire-bonded with the bonding pads of a die are also formed. Together with a lead frame previously prepared, the sheets are stacked in turn and then subjected to sintering, so as to form a package 1 of the desired shape as shown in FIG. 1a. The ceramic package 1 takes its shape through the use of three layers, that is a bottom layer 2, a middle 3 and a top layer 4. Of course, the ceramic package 1 may have more layers.

Next, die bonding is carried out, as shown in FIG. 1b, so as to attach a die (or a chip) 5, which may be a CCD element, on a paddle of the lead frame (not shown) which has been fixed to the ceramic package 1. Then, wires 6 are bonded to the bonding pads (not shown) of the die 5 and each corresponding lead of the lead frame, so as to connect them as shown in FIG. 1c. In order to cover the open portion of the package 1, a glass layer 7 is then formed, as shown in FIG. 1d. The glass layer 7 functions to transmit light to a light receiving region of the CCD element. Thereafter, leads are attached to predetermined positions on both sides of the package 1. FIG. 1e reveals the structure of the finally obtained step-shaped package.

A hollow-type plastic package is assembled in a similar manner. FIGS. 2a through 2f will be used to help illustrate this procedure, while FIG. 2g shows the finished hollow-type plastic package.

Wafer 8 in FIG. 2a is subjected to a dicing process and divided into chips 9, also known as "dies." The dicing process may be accomplished by several means, including a chemical method using acetic acid or fluoroacetic acid, and a scribing method using a diamond cutter.

After the dicing process, die bonding is carried out, so as to attach the die 9 to a paddle 11 of a previously prepared lead frame 10. The lead frame 10, shown in FIG. 2b, also comprises side rails 12, lead fixing means or dambers 14, support bars 15, locking holes 16, and leads 13. Each of the leads 13 includes an inner lead 13a and an outer lead 13b. The lead fixing means or dambers 14 act to maintain a uniform space between adjacent leads 13 and the lead frame 10.

To accomplish the die bonding, an eutectic alloy process may be used. To do so, a gold-antimony alloy is thinly coated on the paddle 11. With the die 9 then seated on the coated gold-antimony alloy layer, the paddle 11 is heated. Through this heating, the gold-antimony alloy is eutectic-welded into the silicon material of the die 9. The heating temperature may be as high as 300° C. to 400° C., depending upon the kind of solder materials used. In order to avoid the oxidation of the die 9 or the paddle 11 under this high temperature, the heating is generally carried out in an atmosphere of inert gas such as nitrogen.

Other die bonding processes may be used, including use of a conductive epoxy based adhesive, a soldering process using a conventional Pb-Sn solder, and a glass soldering process. In the glass process, soldering glass is disposed on a substrate and melted at a temperature of about 500° C. to 600° C. A ceramic die pack is then pressure bonded on the melted soldering glass.

After the die bonding, a wire bonding process is performed, as shown in FIG. 2c. The wire bonding process connects bonding pads 17 of the die 9 with inner leads 13a of the lead frame 10 by means of wires 37. The wires 37 are usually made of aluminum or gold. To accomplish the wire bonding process, one may use a thermal pressure bonding process, an ultrasonic process, a soldering process, a laser process or an electron beam process. The thermal pressure bonding process and the ultrasonic process are preferred in actual practice.

As shown in FIG. 2d, guide blocks 18 are then formed on the die 9 around the both sides of the light receiving region 38 of the die 9. A glass lid 19 is then placed on top of the guide blocks 18, thereby covering the light receiving region 38.

Next, the lead frame 10, to which the die 9 and the wires 37 have been bonded, is positioned in a previously prepared die mold. An epoxy molding compound is then charged into the mold and die molded. This molding encases the die except for the light receiving region 38, which is protected by the guide blocks 18 and the glass lid 19. In this manner, a hollow-type plastic package 20 is formed, as shown in FIG. 2e.

As shown in FIG. 2f, a trimming process is then performed to remove the lead fixing means or dambers 14. Thereafter, a forming process is carried out, so as to form the outer leads 13b into a preferred shape. After the forming process, the outer leads 13b may have a gull-wing shape or a J-bend shape. The completed plastic hollow-type package is shown in FIG. 2g.

The above-mentioned conventional methods of assembling CCD packages, while capable of creating useable packages, have the following disadvantages.

First, the packages manufactured by both of the above conventional methods are relatively heavy and bulky so that when they are used in camcorders and still cameras, they occupy a large volume in the interior of these products, thereby increasing the product's size and weight.

Second, ceramic packages are expensive to manufacture, thereby increasing the cost of the products in which they are used.

Third, in the case of hollow-type plastic packages in which glass lids are laid over the chips, the glass lids have a tendency to shift out of position when the die molding is performed. Consequently, the rate of poor products is increased and productivity is decreased.

Therefore, it is an object of the invention to overcome the above-mentioned disadvantages encountered in the prior art and to provide a method for assembling a CCD package by using a tape (a flexible insulated backing with conductive strips for leads and interconnect surfaces for mating with the terminals of the chip) designed for TAB (Tape Automated Bonding) having leads and a paddle for attaching a die. Through this method, packages of a light, laminated and simple structure can be obtained, thereby decreasing manufacturing costs and simplifying the assembly process.

SUMMARY OF THE INVENTION

In one aspect, the present invention provides a method for assembling a CCD package by using a tape designed for TAB which has a plurality of leads and a plurality of die bonding paddles, comprising the steps of: preparing a tape for a tape automated bonding operation which has a plurality of outer leads and inner leads, and a plurality of die bonding paddles; bonding a chip on said paddles and then bonding the lower surfaces of respective free ends of said inner leads on bonding pads of said chip; forming a light shield layer having both edges attached to certain regions of respective outer leads, beneath the chip; attaching a glass to respective surface portions of the inner leads positioned just above the chip; and performing a trimming process adapted to remove lead fixing dambers and a forming process adapted to shape the outer leads to have a desired shape.

In another aspect, the present invention also provides a CCD package structure comprising: a plurality of inner leads and outer leads each corresponding to each of said inner leads and connected thereto; a chip provided with bonding pads to which the lower surfaces of respective free ends of the inner leads are connected, respectively; a glass lid attached to respective surface portions of the inner leads positioned just above said chip; and a light shield plate having edges attached to respective lower surfaces of the outer leads, beneath the chip.

Other objects and aspects of the invention will become apparent from the following description of embodiments and claims:

DETAILED DESCRIPTION OF THE INVENTION

Prior to the detailed description of the present invention, the TAB process utilized in this invention will be described. The TAB process is an alternative to wire bonding processes in which wires are used to connect chips and leads.

Figure 1A:
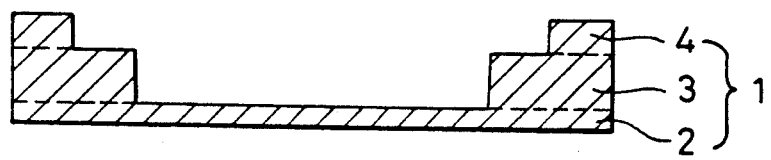
FIGS. 1a to 1e are views illustrating processes for assembling a ceramic CCD package in accordance with the prior art.
Figure 1B:
Figure 1C:
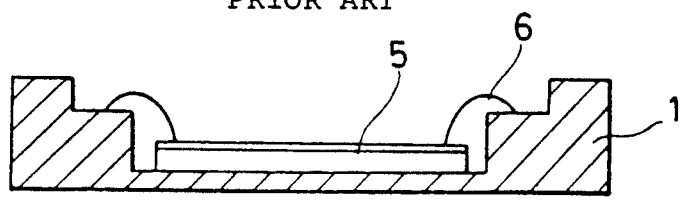
Figure 1D:
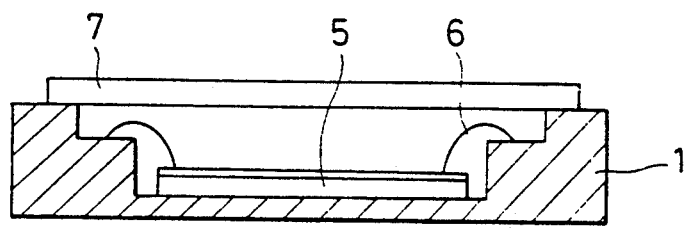
Figure 1E:
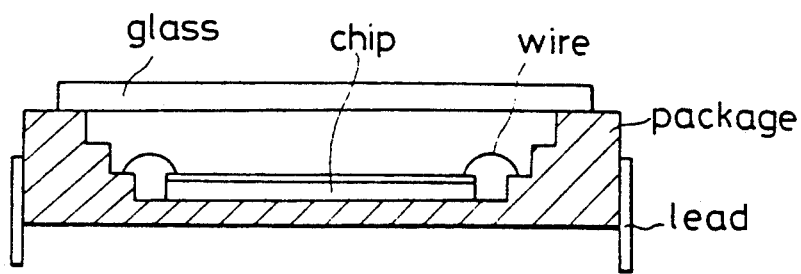
Figure 2A:
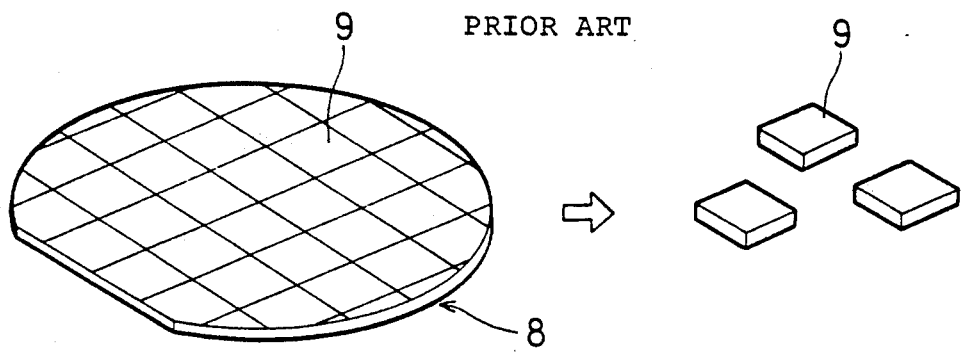
FIGS. 2a to 2g are views illustrating processes for assembling a hollow-type plastic CCD package in accordance with the prior art.
Figure 2B:
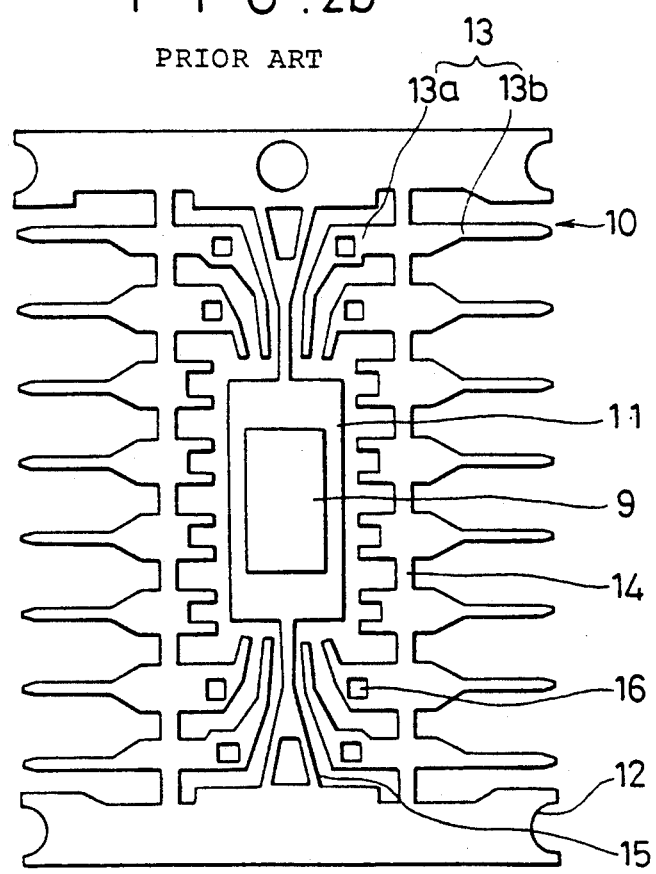
Figure 2C:
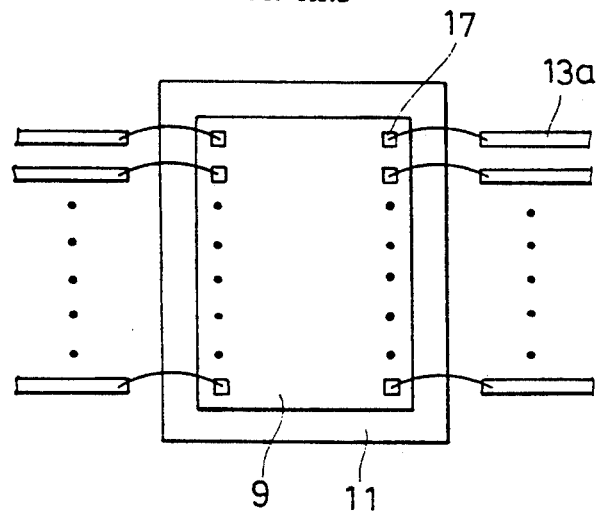
Figure 2D:
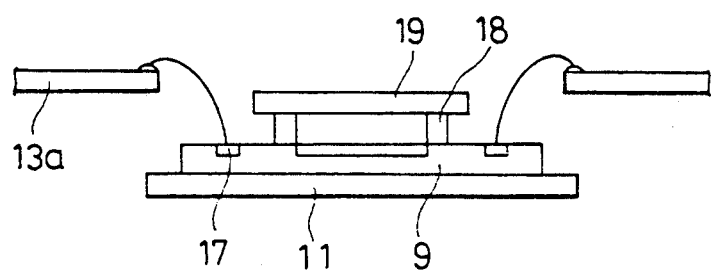
Figure 2E:
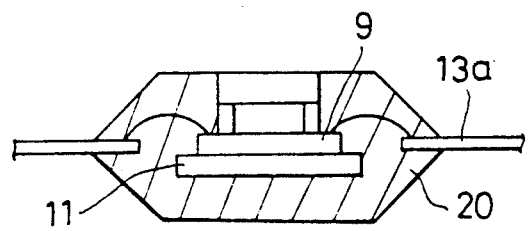
Figure 2F:
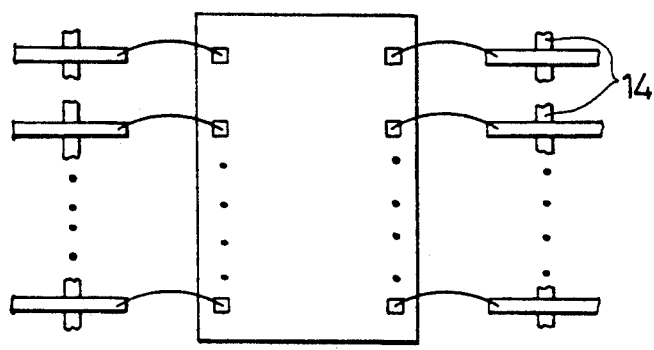
Figure 2G:
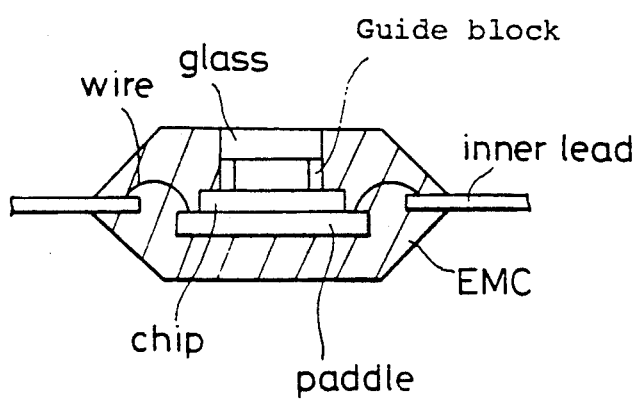
Figure 3:
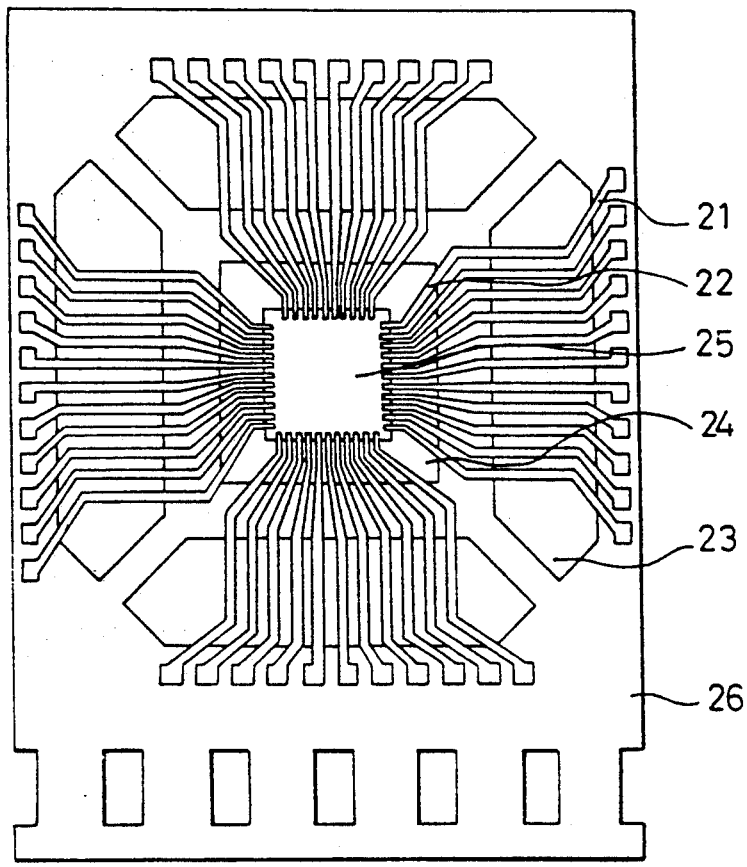
FIG. 3 is a plan view of a tape for TAB.

The TAB process used in this invention requires a tape which is previously manufactured according to a customer's requirement. An example of a tape used in a TAB process is illustrated in FIG. 3. Included in this example are outer leads 21, inner leads 22 having free ends, outer lead windows 23, inner lead windows 24, a paddle 25 to which a die is attached, and a film base 26. Inner leads 22 and outer leads 23 are made of tin plated copper foils. The film base 26 may be made of polyimide or glass epoxy.

Figure 4:
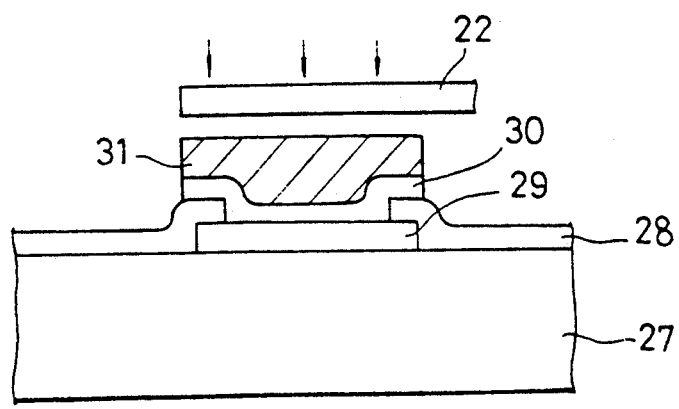
FIG. 4 is a schematic view illustrating an example of conventional TAB processes.

FIG. 4 reveals one embodiment of a conventional TAB process. As a first step in this embodiment, a chip (or die) 27 is prepared which has at its surface numerous bonding pads 29 surrounded by protection coats 28. The bonding pads may be made from aluminum. An inter-metal 30 is then formed on the bonding pad 29. On the inter-metal 30, a bonding bumper 31 is formed. The bonding bumper may be made of gold or lead/tin. Finally, inner leads 22 of the TAB tape are positioned on the bonding bumper 31 and connected to the chip 27 by means of a thermo compression bonder.

Figure 5A:
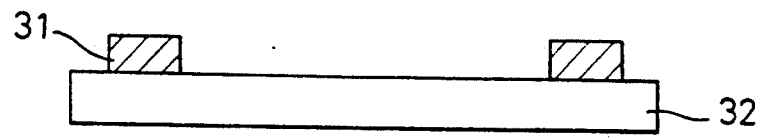
FIGS. 5a to 5c are schematic views illustrating another example of conventional TAB processes.
Figure 5B:
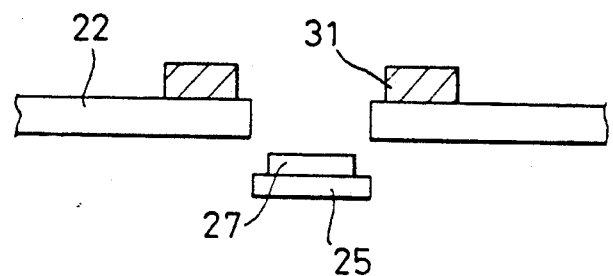
Figure 5C:
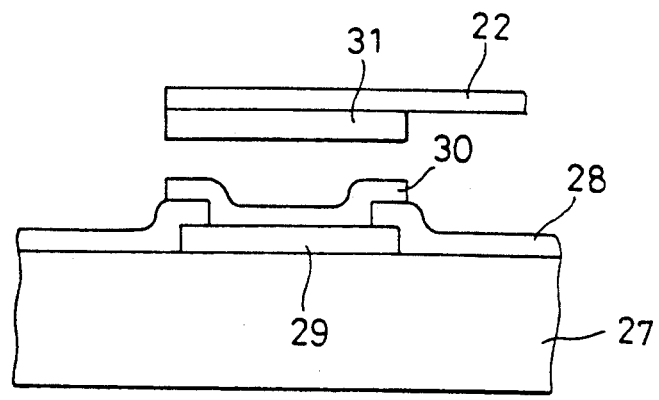

FIGS. 5a to 5c illustrate a second embodiment of a conventional TAB process. present invention. In this embodiment, often called the transferred bump TAB process, a glass 32 is prepared, and then bonding bumpers 31 made of gold are formed on the glass 32. This is shown in FIG. 5a. The arrangement of the bonding bumpers 31 on the glass 32 corresponds to the arrangement of bonding pads 29 on the chip 27. Next, the bonding bumpers 31 are transferred from the glass 32 and attached to the lower surfaces of the respective free ends of the inner leads 22. FIG. 3 displays the free ends of the inner leads 22, while FIG. 5b shows the bonding bumpers 31 attached to the inner leads 22 in an inverted state.

The bonding bumpers 31 attached to inner leads 22 are then seated on the corresponding bonding pads 29 of the chip 27 and then thermally press bonded using a thermo compression bonder as seen in FIG. 5c. This provides the necessary connection between each inner lead 22 and the corresponding bonding pad 29 on chip 27.

The above-described TAB methods are utilized in the present invention, which will now be described in detail. FIGS. 6a to 6f will be referred to in conjunction with this description.

Figure 6A:
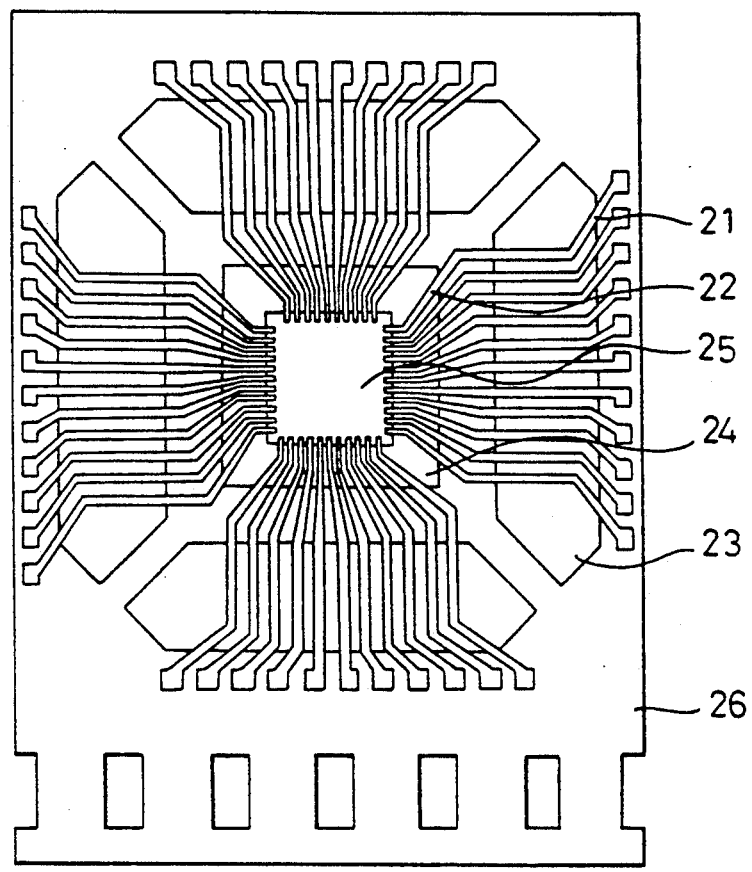
FIGS. 6a to 6f are views illustrating the CCD package and assembling process of the present invention.

As a first step, a tape for TAB having the desired structure is prepared as shown in FIG. 6a. Descriptions of the respective parts of the tape are omitted, since they were described in detail in connection with FIG. 3.

Figure 6B:
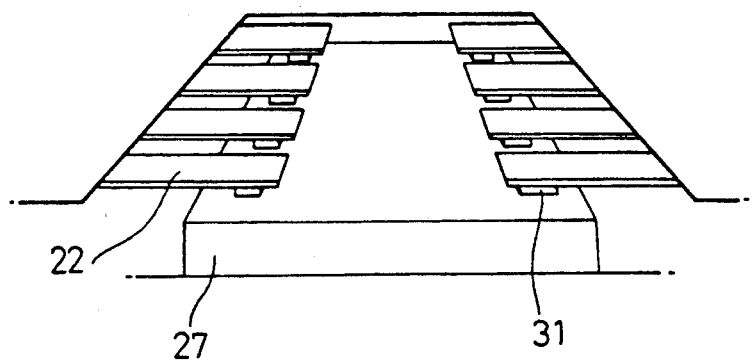

Next, bonding bumpers 31 are formed on the lower surfaces of the free ends of inner leads 22. As shown in FIG. 6b, the bumpers 31 are then seated on the corresponding bonding pads 29 of the chip 27 and thermally press bonded, so as to provide the necessary connection between the inner leads 22 and the chip 27. This is accomplished through one of the TAB processes described above.

Figure 6C:
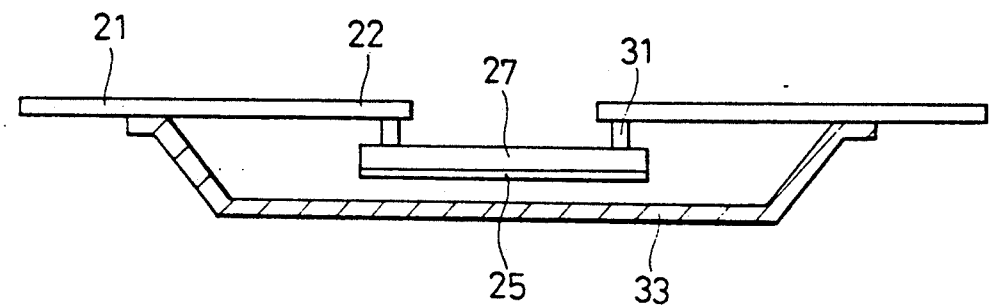

Thereafter, a light shield plate 33 is added beneath the chip 27 as shown in FIG. 6c. The light shield plate 33 prevents light from coming up into the lower portion of the chip 27. The edges K of the shield plate 33 have flat surfaces so that they may be fixedly attached to the lower surfaces of respective outer ends of the outer leads 21.

Figure 6D:
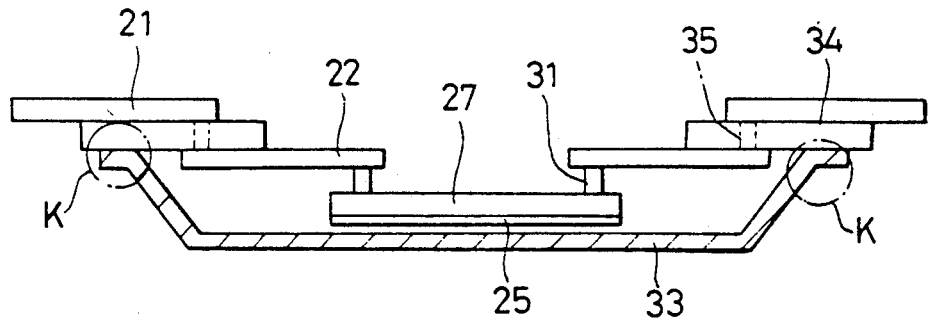

In FIG. 6d, there is shown another embodiment of the present invention. In this embodiment, inner leads 22 of the tape are first separated from outer leads 21. Then, the inner leads 22 are connected with bonding pads 29 of the chip 27, via bonding bumpers 31, in the same manner as shown in FIG. 6b. On the outer surface of each inner lead 22, an insulation 34 having a through hole 35 is then formed. The through holes 35 are filled with conductive material so that outer leads 21 separated from inner leads 22 by insulation 34 will be electrically connected with their respective inner leads 22 via the conductive material in the through holes 35. In this embodiment, the light shield plate 33 is attached to the lower surfaces of the insulations 34 rather than the outer leads 21.

Figure 6E:
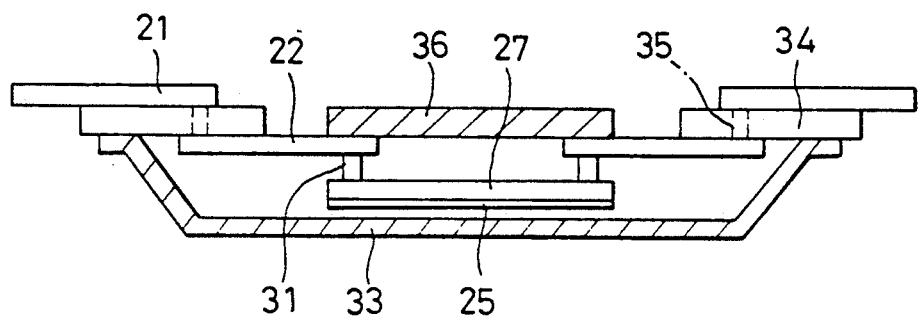

As shown in FIG. 6e, a glass lid 36 is then fixedly attached to the surface portions of the inner leads 22 positioned just above the chip 27. As a result of this arrangement, the light receiving region of the chip 27 is positioned close to the glass lid 36.

Figure 6F:
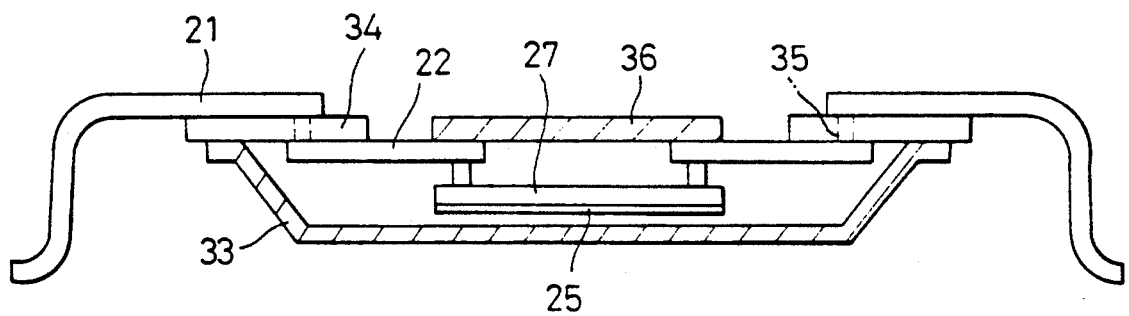

Finally, a forming process is carried out to form the outer leads 21 into a certain shape as shown in FIG. 6f. After the forming process, the outer leads 21 may have a gull-wing shape or a J shape. The process for assembling a CCD package under the present invention is then completed.

As is apparent from the above description, the method and package of the present invention provide the following effects.

First, packages of a light, laminated and simple structure can be obtained, since the method of the present invention utilizes a TAB process in which a laminated tape having a plurality of leads and die-bonded paddles is used. As a result, these packages occupy only a small volume in the interior of products which use CCD elements, such as camcorders and still cameras, thereby enabling the construction of smaller products.

Second, the adhesion between the chip and the inner leads is improved, in that they are attached through the TAB process rather than the wire bonding process utilized in the manufacture of conventional ceramic packages and hollow-type plastic packages. As a result, it is possible not only to reduce the rate of poor products, but also to improve the electric conductivity and heat emissivity of the products.

Third, the construction process is simplified through the elimination of molding and wire bonding processes which have been conventionally required in manufacturing packages. This fact allows a reduction in manufacturing costs.

Finally, the light receiving region of the chip is advantageously positioned close to the glass lid, in that the glass lid is not formed on the package, but rather formed on the inner leads. Accordingly, the light receiving efficiency and the performance of the CCD elements is improved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A CCD package structure comprising:
   a plurality of inner leads and outer leads, each of said outer leads corresponding to each of said inner leads and connected thereto;
   a chip provided with bonding pads to which the lower surfaces of respective free ends of the inner leads are connected, respectively;
   a glass lid attached to respective surface portions of the inner leads positioned just above said chip;
   a light shield plate having edges attached to respective lower surfaces of the outer leads, beneath the chip; and
   said outer leads are separated from said inner leads and are connected with them by means of insulations, each having a through hole filled with conductive material, and said edges of light shield plate are attached to respective lower surfaces of the insulations.

2. A CCD package comprising:
   a tape having at least one paddle and a plurality of inner leads, each inner lead being in electrical connection with a corresponding outer lead, each inner lead having a free end, and each paddle having a top side and a bottom side;
   a chip having a plurality of bonding pads and a light receiving region;
   the chip being connected to the top side of the paddles;
   the bonding pads being connected to the free ends of the inner leads through the use of a plurality of bonding bumpers;
   a glass lid fixed on the inner leads such that the glass lid covers the light receiving region of the chip;
   a light shield covering the bottom side of the paddles, such that light coming from the bottom side of the paddles cannot hit the light receiving region of the chip; and
   said outer leads are separated from said inner leads and connected with them by means of insulations, each having a through hole filled with conductive material, and said edges of said light shield are attached to respective lower surfaces of the insulations.

* * * * *